United States Patent
Taniguchi et al.

(10) Patent No.: US 6,631,147 B2
(45) Date of Patent: *Oct. 7, 2003

(54) ORGANIC SEMICONDUCTOR LASER DEVICE

(75) Inventors: Yoshio Taniguchi, Ueda (JP); Chihaya Adachi, Ueda (JP); Toshiki Koyama, Ueda (JP); Michifumi Nagawa, Machida (JP)

(73) Assignee: Optc Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/395,130

(22) Filed: Sep. 14, 1999

(65) Prior Publication Data
US 2003/0103537 A1 Jun. 5, 2003

(30) Foreign Application Priority Data
Sep. 14, 1998 (JP) ............................................. 10-260709

(51) Int. Cl.$^7$ ................................................. H01S 3/14
(52) U.S. Cl. ............................................ 372/39; 372/53
(58) Field of Search ............................ 372/39, 53, 99, 372/92; 257/40; 428/690

(56) References Cited

U.S. PATENT DOCUMENTS 5,780,174 A * 7/1998 Tokito et al. .................. 372/92
5,998,803 A * 12/1999 Forrest et al. ................. 257/40
6,111,902 A * 8/2000 Kozlov et al. ................. 372/39

* cited by examiner

Primary Examiner—Quyen Leung
(74) Attorney, Agent, or Firm—Reed Smith LLP

(57) ABSTRACT

An organic semiconductor laser device is composed of a positive electrode layer, an electron hole-transporting layer, a light-emitting layer containing an organic dye and having an open end, an electron-transporting layer, and a negative electrode layer in order. The electron hole-transporting layer and the electron-transporting layer satisfy the conditions of $1<n_1/n_2$ and $1<n_1/n_3$ ($n_1$ is a refractive index of the light-emitting layer determined at a wavelength of the light emitted in the light-emitting layer, $n_2$ is that of the electron hole-transporting layer, and $n_3$ is that of the electron-transporting layer) and further satisfy the conditions;

$$0.16 < \frac{n_2 \times d_2 \times \sqrt{\left(\frac{n_1}{n_2}\right)^2 - 1}}{\lambda}$$

$$0.16 < \frac{n_3 \times d_3 \times \sqrt{\left(\frac{n_1}{n_3}\right)^2 - 1}}{\lambda}$$

($d_2$ is a thickness of the electron hole-transporting layer, $d_3$ is a thickness of the electron-transporting layer, and $\lambda$ is the wavelength of light emitted in the light-emitting layer)

9 Claims, 1 Drawing Sheet

ORGANIC SEMICONDUCTOR LASER DEVICE

FIELD OF THE INVENTION

The present invention relates to an organic semiconductor laser device which is excitable by application of electric energy.

BACKGROUND OF THE INVENTION

It is known that some organic dyes such as organic fluorescent dyes emit a light of short wavelength such as a wavelength in the region of 400 to 550 nm when they are excited by stimulating rays. The wavelength of thus emitted light is remarkably shorter than the wavelength of a laser light emitted by the conventionally employed inorganic semiconductor laser device, which generally in the wavelength region of 620 to 800 nm. Accordingly, an organic semiconductor laser employing the organic fluorescent dye is expected to become employable in various technical fields, for instance, for giving a photo information recording and reproducing system of increased data storage density.

An organic dye laser in the form of a solution containing an organic fluorescent dye is known. S. R. Forrest et al., Nature, 389, 362 (1997), R. E. Slusher et al., Appl. Phys. Lett. 72, 2230 (1997), and S. R. Forrest et al., Appl. Phys. Lett. 72, 144 (1998) describe an organic semiconductor laser device of light-exciting type which employs a thin laser-emitting material layer arranged on a glass and a planer waveguide as an optical resonator.

However, organic semiconductor lasers of light-exciting type are not favorably employed for incorporation into electric devices for industrial and personal uses As a light-emitting device which utilizes an organic dye and emits a light by excitation by not light but electric energy, an organic electroluminescence (EL) element is known. The organic electroluminescence element is composed of a positive electrode layer, an electron hole-transporting layer, a light-emitting layer containing an organic dye, an electron-transporting layer, and a negative electrode layer in order, and emits a light on the sides of the electrode layers by applying an electric voltage between both electrode layers. The electroluminescence element, however, has almost no emission directivity. Therefore, the known electroluminescence element cannot be utilized as a laser device.

SUMMARY OF THE INVENTION

Accordingly, it is an object of the invention to provide an organic semiconductor laser device which can be excited by electric energy and efficiently emits a laser light.

There is provided by the present invention an organic semiconductor laser device comprising a positive electrode layer, an electron hole-transporting layer, a light-emitting layer containing an organic dye and having an open end, an electron-transporting layer, and a negative electrode layer in order, under the condition that light emitted in the light-emitting layer by applying a voltage between the positive electrode layer and the negative electrode layer is recovered from the open end of the light-emitting layer, wherein the electron hole-transporting layer and the electron-transporting layer satisfy the following conditions:

$1 < n_1/n_2$ and $1 < n_1/n_3$ (preferably, $1.05 < n_1/n_2$ and $1.05 < n_1/n_3$, more preferably, $1.1 < n_1/n_2$ and $1.1 < n_1/n_3$)

wherein $n_1$ is a refractive index of the light-emitting layer determined at a wavelength of the light emitted in the light-emitting layer, $n_2$ is a refractive index of the electron hole-transporting layer determined at the wavelength of the emitted light, and $n_3$ is a refractive index of the electron-transporting layer determined at the wavelength of the emitted light;

$$0.16 < \frac{n_2 \times d_2 \times \sqrt{\left(\frac{n_1}{n_2}\right)^2 - 1}}{\lambda}$$

$$0.16 < \frac{n_3 \times d_3 \times \sqrt{\left(\frac{n_1}{n_3}\right)^2 - 1}}{\lambda}$$

wherein $n_1$, $n_2$ and $n_3$ have the same meanings as defined above, $d_2$ stands for thickness of the electron hole-transporting layer, $d_3$ stands for thickness of the electron transporting layer, and $\lambda$ stands for the wavelength of light emitted in the light-emitting layer.

DETAILED DESCRIPTION OF INVENTION

Figure 1:
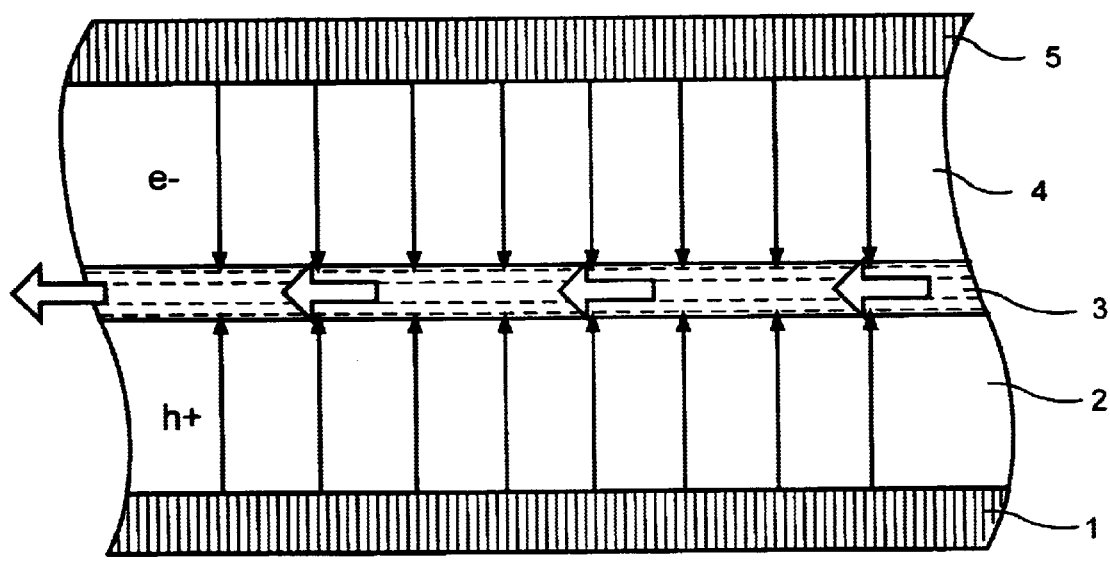
FIG. 1 is a sectional view indicating a structure of an organic semiconductor laser device of the invention.

A representative structure of the organic semiconductor laser device of the present invention is illustrated in FIG. 1. The organic semiconductor laser device of the invention consists essentially of a positive electrode layer 1, an electron hole-transporting layer, a light-emitting layer 3 containing an organic dye and having an open end on its side surface, an electron-transporting layer 4, and a negative electrode layer 5 in order. The structure of the organic semiconductor laser device of the invention is similar to the known electroluminescence (EL) device.

As indicated above, both of the electron hole-transporting layer and the electron-transporting layer of the organic semiconductor laser device of the invention should have a thickness satisfying the specific equation which is defined in terms of the refractive index and thickness of each constitutional layer. The aforementioned specific equation can be derived from the known equation giving a distance at which the strength of evanescent wave diminishes to reach 1/e.

According to the known equation, a distance (Z) at which the strength of evanescent wave diminishes to reach 1/e can be expressed by the following equation:

$$Z = \frac{\lambda}{2n_2\pi\sqrt{n12^2 sin\theta - 1}}$$

[wherein $\lambda$ is a wavelength of light emitted in the light-emitting layer; n12 is $n_1/n_2$ in which $n_1$ is a refractive index of the light-emitting layer determined at $\lambda$ and $n_2$ is a refractive index of an adjacent layer (e.g., the electron hole-transporting layer) determined at $\lambda$, provided that $n_2$ is smaller than $n_1$].

Figure 2:
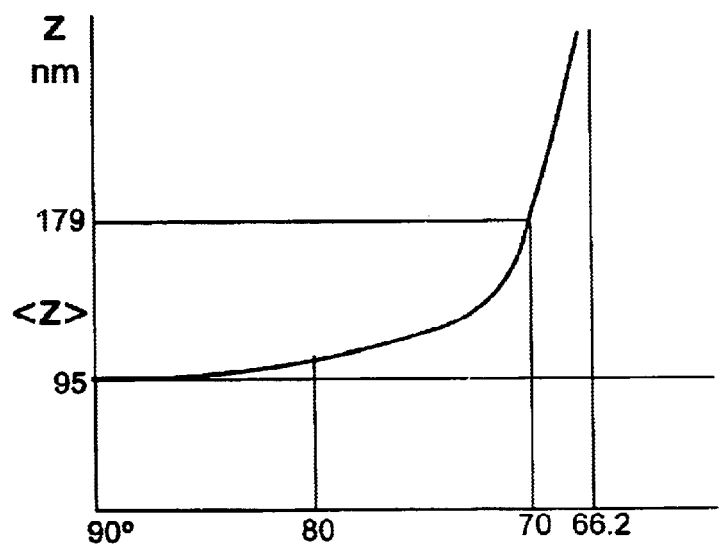
FIG. 2 graphically shows a relationship on an organic semiconductor laser device having 2.11 for $n_1$ (refractive index of the light-emitting layer determined at 510 nm) and 1.96 for $n_2$ (refractive index of the electron hole-transporting layer determined at 510 nm; hence, $n_{12} = n_1/n_2 = 1.09$) between an incident angle (θ) of a light having a wavelength (λ) of 510 nm and a distance (Z) for decreasing the strength of an evanescent wave to reach 1/e.

FIG. 2 attached to the specification graphically shows a relationship on an organic semiconductor laser device having 2.11 for $n_1$ (refractive index of the light-emitting layer determined at 510 nm) and 1.96 for $n_2$ (refractive index of the electron hole-transporting layer determined at 510 nm; hence, $n_{12}=n_1/n_2=1.09$) between an incident angle ($\theta$) of a light having a wavelength ($\lambda$) of 510 nm and a distance (Z) for decreasing the strength of an evanescent wave to reach 1/e, which is calculated from the above-mentioned equation.

As is apparent from FIG. 2 and also from the above-mentioned equation, the distance (Z) is the minimum when the incident angle ($\theta$) is 90°. Accordingly, if the electron hole-transporting layer has a thickness larger than the minimum distance ($Z_{min}$) given when the incident angle ($\theta$) is 90°, the evanescent wave derived from a light which is emitted in the light-emitting layer and impinged to the interface between the light-emitting layer and the electron hole-transporting layer at approximately 90° does not pass through the electron hole-transporting layer and therefore is not absorbed by the positive electrode layer placed on the electron hole-transporting layer. In other words, if the electron hole-transporting layer has a thickness ($d_2$) larger than the minimum distance ($Z_{min}$), some of the light emitted in the light-emitting layer is confined or trapped in the light-emitting layer and released from the open end of the light-emitting layer in the form of a coherent light, that is, a laser light.

The above-described relationship is also applied to the thickness ($d_3$) of the electron-transporting layer which is arranged on the other side of the light-emitting layer.

Thus, the equations of the invention for defining the thickness of the electron hole-transporting layer and the thickness of the electron-transporting layer are derived from the aforementioned equation for the behavior of evanescent wave and also experimentally confirmed.

It is further discovered experimentally that the refractive index and the thickness of each of the electron hole-transporting layer and the electron transporting layer preferably satisfy the following conditions:

For electron hole-transporting layer
$1.20 < n_1/n_2$
$0.23 < (n_2 \times d_2)/\lambda$ For electron-transporting layer
$1.09 < n_1/n_3$
$0.37 < (n_3 \times d_3)/\lambda$ As for the materials for forming the constitutional layers of the organic semiconductor laser device of the invention, most of the materials which are known for forming the layers constituting the known organic electroluminescence device are employable for the organic semiconductor laser device of the invention. The structures and constitutional materials of the layers of the organic semiconductor laser device of the invention are described below.

(1) Positive Electrode Layer

The positive electrode layer serves to incorporate electron holes to the electron hole-transporting layer. The positive electrode layer is preferably formed of a material (such as metal, metal alloy, other electroconductive compound, or their mixture) having a work function of less than 4 eV. Examples of the electrode materials include Au, CuT, ITO (indium tin oxide), $SnO_2$, and ZnO. The positive electrode layer generally has a thickness of 10 nm to 1 $\mu$m, preferably 50 to 200 nm.

(2) The Electron Hole-transporting Layer

The electron hole-transporting layer of the organic semiconductor laser device of the invention has a thickness larger than the thickness of the electron hole-transporting layer of the known organic electrolumescence device, so that most of the light emitted in the light-emitting layer can be trapped or confined in the light-emitting layer and then released from the open end of the light-emitting layer in the form of a coherent light, namely, laser light.

It is not easy, however, to prepare a thick electron hole-transporting layer from materials known for preparing the electron hole-transporting layer of the conventional organic electroluminescence device. This is because most of the known materials for the electron hole-transporting layer of the conventional organic electroluminescence device, which are wholly conjugated polymers such as polyaniline, poly-3,4-ethylene-dioxythiophene, have no electron hole-transporting power enough to transport an electron hole to pass through the thick electron hole-transporting layer.

Accordingly, the electron hole-transporting layer of the organic semiconductor laser device of the invention is preferably formed of a material having a high electron hole-transporting power, which may comprise a compound having two or more electron hole-transporting units and an non-conjugated spacer group which connects these electron hole-transporting units, as well as an electron acceptor which can oxidize the electron hole-transporting units-containing compound.

In more detail, the material forming the electron hole-transporting layer of the organic semiconductor laser device of the invention preferably shows such a high electron hole-transporting power of $1\times10^{-4}$ $cm^2$/V·sec or more at an electric field in the range of $1\times10^5$ to $1\times10^6$ $V/cm^2$. If the electron hole-transporting layer is formed of a material having such a high electron hole-transporting power, an electron hole can be transported through the electron hole-transporting layer of a larger thickness such as 100 nm or more.

1) Compound Having Electron Hole-transporting Units

The high, electron hole-transporting power can be provided by a partly conjugated compound in which each conjugated unit is present under the condition of electrically independent of each other, which shows a small energy dispersion such as lower than 0.2 eV. The small energy dispersion is attained by a small dispersion of effective lengths of the conjugated system contained in the compound.

The compound having a high electron hole-transporting power preferably shows an ionization energy of 5.7 eV or less The compound showing such low ionization energy is easily oxidized by the co-existing electron acceptor and accepts an electron hole supplied by the positive electrode layer. The acceptance of an electron hole from the positive electrode layer is accomplished when an electric current of 20 mA/cm$^2$ or more is accepted by the electron hole-transporting layer at an electric field of $3\times10^5$ V/cm$^2$.

The compound having electron hole-transporting units and having a high electron hole-transporting power which is favorably employed for preparing the electron hole-transporting layer of the organic semiconductor laser device of the invention preferably has an non-conjugated spacer group in conjunction with the electronically conjugated units.

Examples of the electron hole-transporting unit include units derived from diamines, triarylamine oligomers, thiophene oligomers, arylene-vinylene oligomers, and styrylamines. The electron hole-transporting units can be formed of units derived from one or more compounds The non-conjugated spacer group preferably is inactive with respect to the transportation of electron holes. Examples of the non-conjugated spacer groups include ester groups, ether groups, carbonate groups, urethane groups, amide groups, sulfone groups and ketone groups. Other non-conjugated spacer groups can be illustrated by the below-illustrated formula (I):

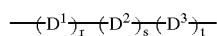

(I)

In the formula (I), each of r, s and t is 0 or an integer of 1 or more, and r+s+t is 1 or more, each of D$^1$ and D$^3$ independently is an ether group, a carbonate group, an ester group, an amide group, a urethane group, an alkylene group having 1 to 30 carbon atoms, a cycloalkylene group having 5 to 30 carbon atoms, a halogenated alkylene group having 1 to 30 carbon atoms, or an aryl-substituted alkylene group having 7 to 30 carbon atoms. D$^2$ may be the same as D$^1$ and D$^3$, or a group represented by the following formula (II)

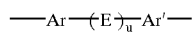

(II)

In the formula (II), E is an alkylene group having 1 to 30 carbon atoms, a cycloalkylene group having 5 to 30 carbon atoms, a halogenated alkylene group having 1 to 30 carbon atoms, or an aryl-substituted alkylene group having 1 to 30 carbon atoms; u is 0 or an integer of 1 or more; and each of Ar and Ar' independently is a substituted or unsubstituted arylene group having 6 to 30 carbon atoms. Examples of the substituents include aryl of 6–24 carbon atoms, alkyl of 1–24 carbon atoms, aralkyl of 7–24 carbon atoms, aryloxy of 6–24 carbon atoms, alkoxy of 1–24 carbon atoms, mono- or dialkylaaino of 1–24 carbon atoms, mono- or diarylamino having aryl of 6–24 carbon atoms, or mono- or dialkylarylamino having alkylaryl of 7–24 carbon atoms.

The non-conjugated spacer group can comprise electron-transporting units, such as divalent units derived from oxazole derivatives, oxadiazole derivatives, naphthalimide derivatives or perylene derivatives In more detail, the divalent units derived from oxazole, oxadiazole, or their derivatives such as those represented by the following formula (III) can be employed:

(III)

In the formula (III), each of R$^1$ and R$^2$ independently represents an arylene group having 6 to 30 carbon atoms or an alkylene group having 1 to 30 carbon atoms, each of Z$^1$ and Z$^2$ independently is a group represented by the formula of —CW= or —N=, Z$^3$ is a group represented by the formula of —NR$^4$— or —SiR$^5$R$^6$—, in which each of R$^3$ through R$^6$ independently is aryl of 6–30 carbon atoms or alkyl of 1–30 carbon atoms.

The non-conjugated spacer group may be a σ-conjugated spacer group, because the σ-conjugated spacer group can connect the electron hole-transporting units maintaining independence of each electron hole-transporting unit. Preferred σ-conjugated spacer groups may comprise one or more Si atoms, such as those represented by the following formula (IV):

(IV)

In the formula (IV), v is an integer of 1 or more, each of R$^7$ and R$^8$ independently is an alkyl group having 1 to 30 carbon atoms or an unsubstituted or substituted aryl group having 6 to 30 carbon atoms. The substituent may be alkyl or alkoxy of 1–24 carbon atoms.

Examples of the compounds having electron hole-transporting units are illustrated below 1) Polymers Having Electron Hole-transporting Units Derived From Diamine or Triarylamine Oligomer, Which are Represented by the Formula (V):

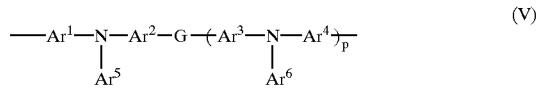

(V)

In the formula (V), each of Ar$^1$ through Ar$^4$ independently is a substituted or unsubstituted arylene group having 6 to 30 carbon atoms; each of Ar$^5$ and Ar$^6$ independently is an alkyl group having 1 to 30 carbon atoms, or a substituted or unsubstituted aryl group having 6 to 30 carbon atoms. The substituent can be alkyl or alkoxy of 1–24 carbon atoms. G is a single bond, an alkylene group having 5 to 30 carbon atoms, a cycloalkylene group having 5 to 30 carbon atoms, an arylene group having 6 to 30 carbon atoms, —O—, —S—, or a divalent group represented by the formula (VI) or (VII):

(VI)

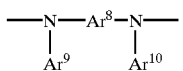 (VII)

In the formulas (VI) and (VII), $Ar^7$ is an aryl group having 6 to 30 carbon atoms, $Ar^8$ is an arylene group having 6 to 30 carbon atoms, each of $Ar^9$ and $Ar^{10}$ is an aryl group having 6 to 30 carbon atoms. The groups for G may have one or more substituents such as those described hereinbefore.

Two or more divalent units of the formula (V) can be connected by a non-conjugated spacer group such as a group of ester, ether, carbonate, urethane, amide, sulfone, ketone or the aforementioned σ-conjugated spacer group Representative examples of the polymer of the formula (V) are conjugated carbonate polymers which are represented by the formula (VIII):

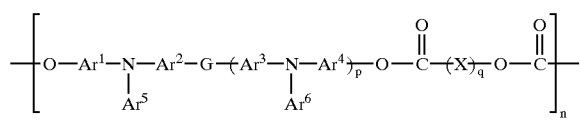 (VIII)

In the formula (VIII), each of $Ar^1$ through $Ar^6$ and G has the same meaning as above, each of p and q is 0, 1 or 2, X is a non-conjugated spacer group, and n is 2 or more.

The most preferable conjugated carbonate polymer is co-poly[3,3'-hydroxytetraphenylbenzidine/diethyleneglycol]carbonate such as that having a number average molecular weight (Mn) of 20,000 and a weight average molecular weight (Mw) of 70,000 which represented by the following formula:

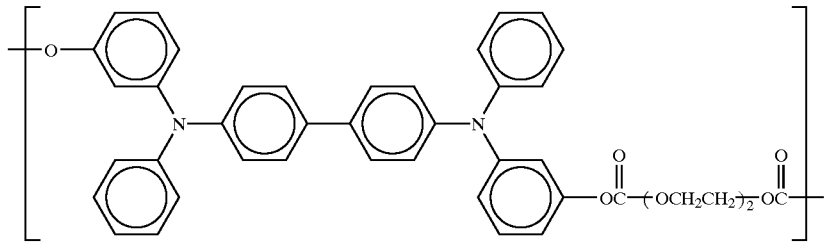

2) Polymers having electron hole-transporting units derived from thiophene oligomer, which are represented by the formula (IX):

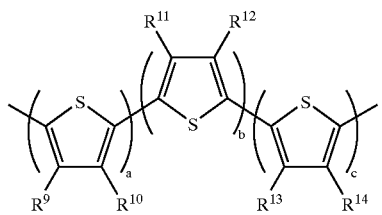 (IX)

In the formula (IX), each of a, b and c is 0 or an integer of 1 to 9, provided that their total number (a+b+c) is 3 or more, and each of $R^9$ to $R^{14}$ independently is a hydrogen atom, or a linear or branched alkyl or alkoxy group having 1 to 15 carbon atoms, provided that at least one of $R^9$ and $R^{10}$ (or $R^{11}$ and $R^{12}$, or $R^{13}$ and $R^{14}$) is not a hydrogen atom.

Two or more divalent units of the formula (IX) can be connected by a non-conjugated spacer group such as ester, ether, carbonate, urethane, amide, sulfone, ketone or the aforementioned σ-conjugated spacer group.

3) Polymers Having Electron Hole-transporting Units Derived From Arylene-vinylene Oligomer, Which are Represented by the Formula (X):

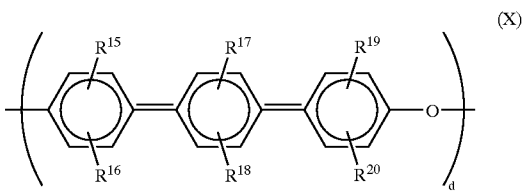 (X)

In the formula (X), each of $R^{15}$ to $R^{20}$ independently is a hydrogen atom, a halogen atom, an alkyl group having 1 to 30 carbon atoms, an aryl group having 6 to 24 carbon atoms, an aralkyl group having 7 to 24 carbon atoms, an aryloxy group having 6 to 24 carbon atoms, an alkylthio group having 1 to 30 carbon atoms, a mono- or di-alkylamino group having alkyl of 1–30 carbon atoms, an arylthio group having 6 to 24 carbon atoms, a mono- or diarylamino group having aryl of 6–24 carbon atoms, a nitro group, or a cyano group d is an integer of 1 to 500.

Two or more divalent units of the formula (X) can be connected by a non-conjugated spacer group such as a group of ester, ether, carbonate, urethane, amide, sulfone, ketone or the aforementioned σ-conjugated spacer group.

4) Polymers Having Electron Hole-transporting Units Derived From Styryl Amine, Which Are Represented By the Formula (XI) Or (XII):

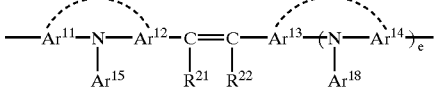 (XI)

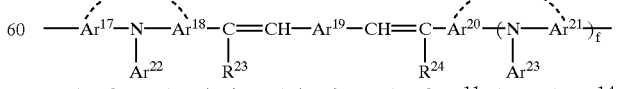 (XII)

In the formulas (XI) and (XII), each of $Ar^{11}$ through $Ar^{14}$ and $Ar^{17}$ through $Ar^{21}$ independently is a substituted or unsubstituted arylene group having 6 to 30 carbon atoms; each of $Ar^{15}$, $Ar^{16}$, $Ar^{22}$ and Ar23 independently is a substituted or unsubstituted aryl group having 6 to 30 carbon atoms; each of $R^{21}$ and $R^{22}$ independently is a hydrogen atom, an alkyl group having 1 to 30 carbon atoms, or a substituted or unsubstituted aryl group having 6 to 30 carbon atoms; each of e and f is 0 or 1; and the dotted curve line means the presence of a single bond or an alkylene group of 1–6 carbon atoms to combine the terminal groups Two or more divalent units of the formula (XI) or (XII) can be connected by a non-conjugated spacer group such as a group of ester, ether, carbonate, urethane, amide, sulfone, ketone or the aforementioned σ-conjugated spacer group.

The electron acceptor to be incorporated into the electron hole-transporting layer serves for oxidizing the electron hole-transporting units of the polymer to impart to the polymer increased electroconductivity such as an electroconductivity of $10^{-10}$ to $10^3$ S·cm$^{-1}$. The electron accepter is preferably incorporated into the electron hole-transporting layer in an amount of $10^{-3}$ to 30 wt. %.

Examples of the electron acceptors include metal halides, Lewis acids, organic acids, and salts of arylamines and metal halides or Lewis acids.

Examples of the metal halides and Lewis acids are $FeCl_3$, $AlCl_3$, $SbCl_3$, $AsF_5$, and $BF_3$.

Examples of the organic acids can be illustrated by the following formula (XIII):

(XIII)

[in which A is an acid group such as sulfonic acid group, phosphoric acid group, boric acid group, or carboxylic acid group; R is an alkyl, alkoxy or alkylthio group having 1 to 20 carbon atoms, an alkoxlkyl, alkylthioalkyl, or alkenyl group having 2 to 20 carbon atoms, a cycloalkyl group having 5 to 20 carbon atoms, an aryl group having 6 to 20 carbon atoms, an alkaryl or aralkyl group having 7 to 20 carbon atoms, a heterocyclic group such as pyridyl, quinolyl, furanyl, pyrrolyl or thienyl, a halogen atom, a nitro group, a cyano group, or an epoxy group; and m is an integer of 0 to 5].

The organic acid can be a polymer acid which contains an acid group (such as "A" in the formula (XIII)). Examples of the polymer acids include sulfonated polystyrene, sulfonated polyethylene, sulfonated polycarbonate, and polyacrylic acid.

Examples of the salts of arylamines and metal halides or Lewis acids may be illustrated by the following formula (XIV):

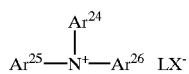

(XIV)

[in which L is a metal halide or a Lewis acid; X$^-$ is an anion such as a halogen ion; each of Ar$^{24}$ through Ar$^{26}$ independently is a substituted or unsubstituted aromatic group having 5 to 30 carbon atoms or a heterocyclic group].

A preferred electron acceptor represented by the formula (XIV) is tris(4-bromophenyl)ammonium hexachloroantimonate having the following formula:

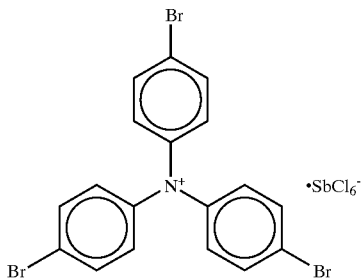

TBAHA

The electron acceptors can be employed singly or in combination.

In consideration of the electroconductivity provided by the known and above-mentioned electron hole-transporting materials, the thickness of the electron hole-transporting layer of the organic semiconductor laser device of the invention preferably is less than 2,000 nm.

(3) Light-emitting Layer

The light-emitting layer may contain a known fluorescent dye. The dye preferably shows a population inversion at a low exciting energy so that the organic dye can produce an emission at an electric current having a low energy (i.e., low electric current density). Preferred organic dyes have a laser threshold value such as less than 50 μJ, more preferably less than 1 μJ. Examples of the preferred organic dyes are described below.

An emission in the ultraviolet or near ultraviolet region can be produced using a para-polyphenylene dye which can be substituted with one or more substituents such as alkoxy, hydroxy, sulfonyl, carboxy, alkoxycarbonyl, amino, dimethylamino or diphenylamino. Examples of the para-polyphenylene dyes are p-quaterphenyl, 3,5,3',5'-tetra-t-butyl-p-quinqphenyl, and 3,5,3',5'-tetra-t-butyl-p-sequisiphenyl.

A blue or green emission can be produced using a fluorescent brightener belonging to benzothiazole type, benzoimidazole type or benzoxazole type, a metal chelate oxinoide compound, and a styrylbenzene compound. Organic dimethylidine compounds described in European Patent No. 388 768 can be employed. Examples of the organic dimethylidine compounds are 1,4-phenylenedimethylidine, 4,4'-biphenylenedimethylidine, 2,5-xylylenedimethylidine, 2,6-naphthylinedimethylidine, 1,4-p-terephenylenedimethylidine, 4,4'-bis(2,3-diphenylvinyl)biphenyl (DTBWBi), 4,4'-bis(2,2-dipheylvinyl)biphenyl (DPVBi), and their derivatives.

Further, compounds having the following formula (XV) which are described in Japanese Patent Provisional Publication H5-258862 can be employed:

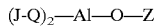 (XV)

[in which Z is a benzene-ring containing-hydrocarbyl group having 6 to 24 carbon atoms; O—Z is a phenolate ligand; Q is a substituted 8-quinolilate ligand; and J is a substituent of the 8-quinolilate ring which disturbs attachment of more than 2 substituted 8-quinolilate ligand to the aluminum atom by steric hindrance].

Examples of these compounds are bis(2-methyl-8-quinolilate) (p-phenylphenolate)aluminum(III) and bis(2-methyl-8-quinolilate) (1-naphthlate)aluminum(III).

A mixture of blue or green emissions can be produced using the above-mentioned dye with a dopant, as described in Japanese Patent Provisional Publication H6-9953. The dopant may be a dye of blue or green region, such as cumarin or the above-mentioned dye for the blue or green emission A preferred combination is a dopant having a diphenylaminovinylarylene skeleton such as 4,4'-[4-(N,N-diphenylamino)styryl]benzene (DPAVB) and a host compound having a distyrylarylene skeleton such as DPVBi.

Diaminostyrylbenzene (DADSB) having the following formula has a low laser threshold value such as less than 1 μJ, and therefore is favorably used as a light-emitting compound of the organic semiconductor laser of the invention:

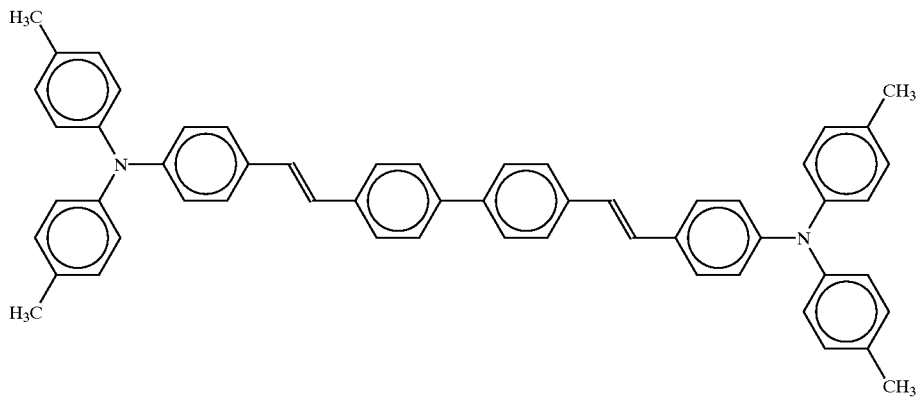

The light-emitting layer generally has a thickness of 5 to 500 nm.

(4) Electron-transporting Layer

The electron-transporting layer receives electrons from the negative electrode layer and transmit the received electrons to the light-emitting layer. For the formation of the electron-transporting layer, electron-transporting materials which are known for the formation of an organic electroluminescence (EL) device can be employed.

Examples of the electron-transporting materials include heterocyclic tetracarboxylic anhydrides such as nitro-substituted fluorene derivatives, diphenylquinoline derivatives, thiopyranedioxide derivatives and naphthaleneperylene, carbodiimides, fluorenidenemethane derivatives, anthraquinodimethane and anthrone derivatives, and oxadiazole derivatives.

Further, a series of electron-transporting compounds described in Japanese Patent Provisional Publication 59-194393 can be employed.

Further, thiadiazole derivatives and quinoxaline derivatives having a electron-attracting quinoxaline ring can be employed as the electron-transporting materials.

Furthermore, metal complexes of the 8-quinolynol derivatives such as tris(8-guinolynol)aluminum (Alq), tris(5,7-dichloro-8-quinolynol)aluminum, tris(5,7-dibromo-8-quinolynol)aluminum, tris(2-methyl-8-quinolynol) aluminum, tris(5-methyl-8-quinolynol)aluminum, and bis(8-quinolynol)zinc can be employed as the electron-transporting materials. These complexes can be also employed in the case that the metal atom is replaced with In, Mg, Cu, Ca, Sn, Ga or Pb Also employable are metal phthalocyanines, metal-free phthalocyanines, metal or metal-free phthalacyanines having a substituent such as an alkyl group or a sulfonic acid group. Also employable are inorganic semiconductor materials such as n-Si and n-SiC.

The electron-transporting layer preferably contains an electron doner such as an alkali metal, an alkaline earth metal, their fluorides, chlorides, or iodides in an amount of 0.1 to 30 molar %. The incorporation of the electron doner increases the electron-transporting power so that the thick electron-transporting layer of the organic semiconductor laser device of the invention can smoothly transport electrons to the light-emitting layer.

In consideration of the electroconductivity provided by the known and above-mentioned electron-transporting materials, the thickness of the electron-transporting layer of the organic semiconductor laser device of the invention preferably is less than 2,000 nm.

(5) Negative Electrode Layer

The negative electrode layer supplies electrons to the electron-transporting layer. The negative electrode layer is preferably produced using a metal, metal alloy, an electroconductive material or their mixtures to show a low work function such as those less than 4 eV Examples of the electrode materials are Na, Na/K alloy, Mg, Li, Mg/Cu mixture, Mg/Ag alloy, Al/Li alloy, Al/Al$_2$O$_3$ mixture, In, and rare earth elements.

The negative electrode layer generally has a thickness of 10 nm to 1 μm, preferably 50 to 200 nm.

The organic semiconductor laser device of the invention can be manufactured by the following procedures.

1) On an appropriate substrate such as a glass plate, a positive electrode layer is formed by vapor deposition or sputtering.

2) On the positive electrode layer, the electron hole-transporting layer, light-emitting layer and electron-transporting layer are formed in order by appropriate methods such as spin-coating, casting, vapor deposition, or sputtering. The electron hole-transporting layer is preferably formed by spin-coating, while the light-emitting layer and electron-transporting layer are preferably formed by vapor deposition. The conditions of vapor deposition for the formation of the light-emitting layer and electron-transporting layer are variable, but the conditions such as a boat-heating temperature of 50 to 400° C., vacuum of $10^{-6}$ to $10^3$ Pa, deposition rate of 0.001 to 50 nm/sec, and a substrate temperature of $-50°$ C. to 200° C. are preferably employed.

3) On the electron-transporting layer, a negative electrode layer is formed by an appropriate method such as vapor deposition or sputtering.

The sequence of the formation of the above-mentioned layer can be reversed, if desired.

The invention is further described by the following examples.

EXAMPLE 1

A glass plate having an ITO layer of 150 nm thick was washed with oxygen plasma for 30 seconds using a plasma washing means (BPI, available from Samco International Corp.). On thus washed ITC layer, co-poly[3,3'-hydroxytetraphenylbenzidine/diethyleneglycol]carbonate is deposited under vacuum to form an electron hole-transporting layer of 220 nm thick.

On the electron hole-transporting layer, the aforementioned diaminostyrylbenzene (DADSB) was deposited under vacuum to form a light-emitting layer of 100 nm.

On the light-emitting layer, an oxadiazole derivative having the following formula was deposited under vacuum to form an electron-transporting layer of 240 nm thick:

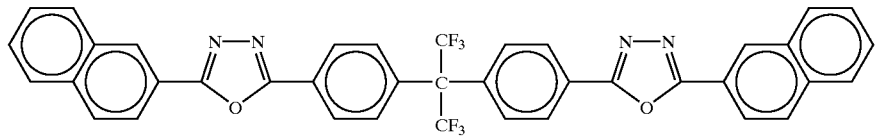

Finally, on the electron-transporting layer, Mg/Ag alloy was deposited under vacuum to form a negative electrode layer of 200 nm.

Thus, an organic semiconductor laser device of the invention having the structure illustrated in FIG. 1 was manufactured. The refractive indexes of the functional layers were as follows:

| | |
|---|---|
| Electron hole-transporting layer: | 1.75 |
| Light-emitting layer: | 2.11 |
| Electron-transporting layer: | 1.93 |

To thus manufactured organic semiconductor laser device was applied a voltage of $-30$ V. It was confirmed that a laser light was emitted from the open end of the light-emitting layer. The peak wavelength ($\lambda$) of the laser light was 510 nm.

EXAMPLE 2

The procedures of Example 1 were repeated except that the electron hole-transporting layer was prepared by coating a solution of the co-poly[3,3'-hydroxytetraphenylbenzidine/diethyleneglycol]carbonate (50 mg) and the tris(4-bromophenyl)ammonium hexachloroantimonate (5 mg) in 1 mL was spin-coated on the positive electrode layer at 1,000 r.p.m., and heating the coated layer to 80° C. for 1 hour for removing the solvent, to form an electron hole-transporting layer of 650 nm thick To thus manufactured organic semiconductor laser device was applied a voltage of $-30$ V. It was confirmed that a laser light was emitted from the open end of the light-emitting layer. The peak wavelength ($\lambda$) of the laser light was 510 nm.

Comparison Example 1

The procedures of Example 1 were repeated except that the electron hole-transporting layer was formed to have a thickness of 50 nm and the electron-transporting layer was formed to have a thickness of 50 nm.

To thus manufactured organic light-emitting device was applied a voltage of $-30$ V. It was confirmed that no laser light was emitted from the open end of the light-emitting layer.

What is claimed is:

1. An organic semiconductor laser device comprising a positive electrode layer, an electron hole-transporting layer, a light-emitting layer containing an organic dye and having an open end, an electron-transporting layer, and a negative electrode layer in order, under the condition that light emitted in the light-emitting layer by applying a voltage between the positive electrode layer and the negative electrode layer is recovered from the open end of the light-emitting layer, wherein the electron hole-transporting layer and the electron transporting layer satisfy the following conditions:

$$1 < n_1/n_2 \text{ and } 1 < n_1/n_3$$

wherein $n_1$ is a refractive index of the light-emitting layer determined at a wavelength of the light emitted in the light-emitting layer, $n_2$ is a refractive index of the electron hole-transporting layer determined at the wavelength of the emitted light, and $n_3$ is a refractive index of the electron-transporting layer determined at the wavelength of the emitted light;

$$0.16 < \frac{n_2 \times d_2 \times \sqrt{\left(\frac{n_1}{n_2}\right)^2 - 1}}{\lambda}$$

$$0.16 < \frac{n_3 \times d_3 \times \sqrt{\left(\frac{n_1}{n_3}\right)^2 - 1}}{\lambda}$$

wherein $n_1$, $n_2$ and $n_3$ have the same meanings as defined above, $d_2$ stands for thickness of the electron hole-transporting layer, $d_3$ stands for thickness of the electron transporting layer, and $\lambda$ stands for the wavelength of light emitted in the light-emitting layer; and wherein the thickness of the electron hole-transporting layer is less than 2000 nm and the thickness of the electron-transporting layer is less than 2000 nm.

2. The semiconductor laser device of claim 1, wherein the electron hole-transporting layer and the electron-transporting layer satisfy the following conditions:

$$1.05 < n_1/n_2 \text{ and } 1.05 < n_1/n_3$$

wherein each of $n_1$, $n_2$ and $n_3$ have the same meaning as defined in claim 1.

3. The semiconductor laser device of claim 1, wherein the electron hole-transporting layer satisfies the following conditions:

$$1.20 < n_1/n_2 \text{ and } 0.23 < (n_2 \times d_2)/\lambda$$

wherein each of $n_2$, $n_2$, $d_2$ and $\lambda$ have the same meaning as defined in claim 1.

4. The semiconductor laser device of claim 1, wherein the electron-transporting layer satisfies the following conditions:

$$1.09 < n_1/n_3 \text{ and } 0.37 < (n_3 \times d_3)/\lambda$$

wherein each of $n_1$, $n_3$, $d_3$ and $\lambda$ have the same meaning as defined in claim 1.

5. The semiconductor laser device of claim 1, wherein the electron hole-transporting layer comprises a compound having two or more electron hole-transporting units and a non-conjugated spacer group connecting the electron hole-transporting units, and an electron acceptor.

6. The semiconductor laser device of claim 1, wherein the electron hole-transporting layer comprises a compound having a non-conjugated skeleton and at least two aromatic rings attached to the non-conjugated skeleton and at least one electron acceptor selected from the group consisting of metal halides, Lewis acids, organic acids, and salts of aryl amines, and metal halide or Lewis acids.

7. The semiconductor laser device of claim 1, wherein the electron hole-transporting layer comprises co-poly[3,3'-hydroxytetraphenylbenzidine/hexamethylene]-carbonate and tris(4-bromophenyl)ammonium hexachloroantimonate.

8. The semiconductor laser device of claim 1, wherein the electron-transporting layer comprises an oxadiazole derivative.

9. The semiconductor laser device of claim 1, wherein the electron-transporting layer comprises an electroconductive polymer and an electron doner.

* * * * *